United States Patent
Gomez et al.

(10) Patent No.: US 7,661,048 B2
(45) Date of Patent: Feb. 9, 2010

(54) APPARATUS AND METHOD FOR EMBEDDED BOUNDARY SCAN TESTING

(75) Inventors: Joseph Jonas Gomez, Naperville, IL (US); Kendall T. Krueger, Naperville, IL (US); Greg A. Martin, Lisle, IL (US); Robert Paul Tarr, Saint Charles, IL (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 250 days.

(21) Appl. No.: 11/770,862

(22) Filed: Jun. 29, 2007

(65) Prior Publication Data

US 2009/0006915 A1 Jan. 1, 2009

(51) Int. Cl.
*G01R 31/28* (2006.01)

(52) U.S. Cl. ..................................... 714/727
(58) Field of Classification Search ................. 714/727
See application file for complete search history.

(56) References Cited

U.S. PATENT DOCUMENTS

| | | | |
|---|---|---|---|
| 5,623,503 A | 4/1997 | Rutkowski | |
| 5,673,276 A | 9/1997 | Jarwala et al. | |
| 5,774,477 A | 6/1998 | Ke | |
| 5,935,266 A | 8/1999 | Thurnhofer et al. | |
| 6,108,807 A | 8/2000 | Ke | |
| 6,124,715 A | 9/2000 | Chakraborty | |
| 6,378,094 B1 | 4/2002 | Chakraborty et al. | |
| 6,584,590 B1 | 6/2003 | Bean | |
| 6,983,441 B2 * | 1/2006 | Wescott | 716/17 |
| 7,017,081 B2 | 3/2006 | Gomez | |
| 7,080,789 B2 * | 7/2006 | Leaming | 235/492 |
| 7,149,943 B2 | 12/2006 | Van Treuren et al. | |
| 7,251,763 B2 * | 7/2007 | Halliday et al. | 714/727 |
| 7,451,367 B2 * | 11/2008 | Pedersen | 714/718 |

* cited by examiner

*Primary Examiner*—James C Kerveros
(74) *Attorney, Agent, or Firm*—Fay Sharpe, LLP

(57) ABSTRACT

Embedded boundary scan testing apparatus and methodologies are disclosed for testing processor-based circuit boards without processor intervention. A boundary scan controller is embedded in a circuit board along with a boundary scan chain having JTAG devices connected with an electrical circuit of the board. Upon power up, the boundary scan controller holds an on-board processor system in reset, loads boundary scan test vectors and commands from an on-board non-volatile memory, and runs boundary scan testing while holding the processor system in the reset state. The boundary scan controller preferably includes a test access port controller that implements only a subset of the JTAG standard 16 machine states to optimize performance and minimize controller hardware. The test results may be stored in an externally accessible on-board memory for subsequent retrieval in order to facilitate board troubleshooting and/or repair, where the provision of on-board boundary scan testing allows testing of boards while installed in the field, and the embedded scan controller allows field testing of on-board processor systems and related circuitry to enhance the test coverage over processor-driven boundary scan testing.

22 Claims, 7 Drawing Sheets

| | COMMAND | BYTE 1 | BYTE 2 | BYTE 3 |
|---|---|---|---|---|
| TAP State Transition | Test-Logic-Reset | 0x01 | 0x00 | 0x00 |
| | Run-Test/Idle | 0x02 | 0x00 | 0x00 |
| | Shift-DR | 0x05 | 0x00 | 0x00 |
| | Pause-DR | 0x06 | 0x00 | 0x00 |
| | Shift-IR | 0x0C | 0x00 | 0x00 |
| Controller Directive | SHIFT | 0x11 | Count (MSB) | Count (LSB) |
| | Vector | TDO | Expected TDI | TDI Mask |
| | DEV_PAT | 0x13 | 0xAA or 0x55 | 0x00 |
| | END | 0x12 | 0x00 | 0x00 |

Valid Command Sequences

| Current ↓ \ Next → | Test-Logic-Reset | Run-Test/Idle | Shift-DR | SHIFT | Pause-DR | Shift-IR | END | DEV_PAT |
|---|---|---|---|---|---|---|---|---|
| Test-Logic-Reset | ✓ | ✓ | Error | Error | Error | Error | ✓ | ✓ |
| Run-Test/Idle | ✓ | Error | ✓ | Error | Error | ✓ | Error | ✓ |
| Shift-DR | ✓ | ✓ | Error | ✓ | Error | Error | Error | Error |
| SHIFT | ✓ | Error | ✓ | Error | ✓ | Error | Error | Error |
| Pause-DR | ✓ | Error | Error | Error | Error | Error | Error | Error |
| Shift-IR | ✓ | Error | Error | ✓ | Error | Error | Error | Error |

| 0 | 1 | 2 | 3 | 4 | 5 | 6 | 7 |
|---|---|---|---|---|---|---|---|
| EBS Memory Address | | | TDI Actual | TDI Expected | TDI Mask | Test Number | Sequence Error |

400

APPARATUS AND METHOD FOR EMBEDDED BOUNDARY SCAN TESTING

FIELD OF THE INVENTION

This invention relates generally to the field of hardware circuit testing, and more particularly to improved boundary scan apparatus for testing printed circuit boards.

BACKGROUND OF THE INVENTION

Electronic circuits are typically constructed in the form of a printed circuit board (PCB) that includes a plurality of electronic components soldered to a circuit board substrate having conductive traces interconnecting various device terminals to form an electrical circuit. As PCBs and the implemented electrical circuits thereof are often complex, board testing at manufacture has become increasingly automated. In this respect, board testing apparatus has evolved from simple I/O functional testers that connect to I/O connectors of a populated PCB for high level automated functional testing, to so-called "bed of nails" test fixtures that include probe pins to make electrical contact with all or some circuit nodes of a tested board for performance of high level and some lower level testing, to integrated testing devices that provide for automated testing of a PCB without the need to externally probe individual circuit nodes. The Joint Test Action Group (JTAG) has developed a circuit board testing standard IEEE 1149.1 including Test Access Port (TAP) and boundary scan testing of hardware via test devices included on the tested boards. The boundary scan type testing involves controlling and monitoring boundary pins of a JTAG compatible device under control of software to provide test coverage beyond that which might be possible using ordinary bed of nails fixturing. This is particularly true of modern multi-layer boards with dense coverage of the top and bottom by fine-pitch components where there is often no external access to many circuit nodes routed through internal layers and underneath component parts, where boundary scan techniques have become widely accepted in industry.

The JTAG devices are connected via a serial data link providing commands to the devices so as to allow controlled temporary isolation of the pins of JTAG compatible devices. In this arrangement, the pin on one isolated JTAG device can be set to a known test state voltage and the voltage of a pin on another isolated JTAG compatible device can be measured to determine whether the monitored pin is in the correct state. Thus, the boundary scan technique can be employed in conjunction with a series of predetermined test vectors to test any number of circuit nodes on a PCB in automated fashion. The output tested node states can then be compared with the correct states to ascertain any circuit board failures, whether in the board itself or in one or more components soldered to a populated board.

Many modern circuit boards include processor systems, whether microprocessors, microcontrollers, programmable logic, DSPs, etc., and associated circuitry (processor, system controller, etc.). Testing of such processor-based PCBs using the IEEE 1149.1 TAP boundary scan techniques has heretofore been performed under control of the on-board processor to provide controlled boundary scan as a diagnostic feature upon powering up the board. In these implementations, the processor and associated components on the board must be functional to read test vectors from memory and to either shift the vectors out through a serial port or pass them to a hardware device that shifts them to the TAP system on the board. In this configuration, however, boundary scan testing is not possible if there are problems in the processor, memory, or other associated circuitry, as the testing is reliant upon the processor to manage the boundary scan devices. Furthermore, even if the processor-related circuitry is functional to allow the boundary scan tests to run, this testing cannot include the processor-related circuitry itself, whereby on-board processor controlled boundary scan testing provides less than complete test coverage. In a manufacturing setting, external boundary scan test controls can be connected to a PCB to implement testing of the processor and related circuits, with the processor being held in a reset state during testing. While this form of external boundary scan test control provides a higher level of test coverage, this feature does not aid in field diagnostic testing where PCBs must often be verified in a field installation with no access by external test equipment. Thus, there remains a need for improved boundary scan testing apparatus and methodologies by which better test coverage can be obtained for printed circuit boards without the need for external boundary scan test controllers.

SUMMARY OF THE INVENTION

The following is a summary of one or more aspects of the invention to facilitate a basic understanding thereof, wherein this summary is not an extensive overview of the invention, and is intended neither to identify certain elements of the invention, nor to delineate the scope of the invention. Rather, the primary purpose of the summary is to present some concepts of the invention in a simplified form prior to the more detailed description that is presented hereinafter. The various aspects of the present disclosure relate to circuit board testing, wherein an embedded boundary scan controller is provided on a PCB to facilitate testing IEEE 1149.1 compliant devices and their associated interconnections without requiring an on-board processor to be functioning. For processor-based boards, the embedded boundary scan controller holds the processor system in reset, loads test vectors and commands from an on-board non-volatile memory, and runs boundary scan testing while the processor system is held in reset, and stores the error report results in an on-board memory, where the loading and running of the vectors and commands may be streamed with a single vector/command being loaded and run before the next vector/command is loaded. The boundary scan controller thus provides board level testing in field installations without processor system intervention. If enough of the PCB electrical circuitry is functioning, the error report can be read and analyzed to aid in board repair or troubleshooting. The provision of an on-board boundary scan testing system also enhances the test coverage by allowing the processor and related circuitry to be tested while the processor system is held in reset, and advantageously can be implemented without the need for connection to external test equipment. The disclosure thus contemplates automated testing of circuit boards for diagnostic purposes even in field installations, while providing fuller test coverage than the conventional on-board processor-controlled boundary scan techniques.

In accordance with one or more aspects of the disclosure, a circuit board apparatus is provided with embedded boundary scan testing capabilities. The apparatus is comprised of a PCB populated with electronic circuit components forming an electrical circuit, which may include a processor system forming part of the electrical circuit and having a reset control input. The board apparatus also provides a boundary scan chain comprising a plurality of JTAG devices including one or more components of the processor system connected with the electrical circuit, and an embedded (on-board) boundary scan controller (EBS controller) and TAP controller. The EBS controller includes a reset output to hold the on-board processor system in a reset state during boundary scan testing, and operates to control the JTAG compliant test access port (TAP) controller coupled with the boundary scan chain devices to perform boundary scan testing of the electrical circuit while the processor system is held in reset. In certain embodiments, the apparatus may include on-board memory for storage of boundary scan results, as well as a UART or other apparatus allowing retrieval of the test results by an external device. The apparatus may also provide for on-board non-volatile memory to store boundary scan test vectors and commands, where the scan controller reads these from the non-volatile memory for use in performing the boundary scan testing.

In certain embodiments, moreover, the TAP controller is optimized by implementing only a limited number of valid command sequences so that the state machine transitions to fewer than half the standard TAP machine states (i.e., transitions through more than 8 of the 16 standard TAP machine states) to reduce the size of the circuitry needed for the controller, where the state machine terminates the testing for invalid command sequences. In one example, the TAP controller operates to transition to only 5 of 16 possible TAP controller machine states, including Test-Logic-Reset, Run-Test/idle, Shift-DR, Pause-DR, and Shift-IR.

Still other aspects of the disclosure relate to an embedded boundary scan testing system for testing an electrical circuit of a printed circuit board. The testing system comprises a boundary scan chain including a plurality of JTAG devices mounted on a circuit board and operatively coupled with an electrical circuit of the circuit board, and a boundary scan controller mounted on the circuit board. The system also includes a JTAG compliant test access port controller operatively coupled with the boundary scan chain to perform boundary scan testing of the electrical circuit while any board-mounted processor system forming part of the electrical circuit of the board is held in a reset state.

Further aspects of the disclosure provide methods for embedded boundary scan testing of printed circuit boards. The methods include applying power to the board and holding an on-board processor system in a reset state. Boundary scan test vectors and commands are loaded from an on-board non-volatile memory into an on-board boundary scan controller, typically one at a time, and boundary scan testing is performed using an on-board boundary scan chain with a plurality of JTAG devices while holding the processor system in reset. The method may further include storing boundary scan test results in an externally accessible on-board memory for later retrieval in board repair or troubleshooting situations.

BRIEF DESCRIPTION OF THE DRAWINGS

The following description and drawings set forth in detail certain illustrative implementations of the invention, which are indicative of several exemplary ways in which the principles of the invention may be carried out. Various objects, advantages, and novel features of the invention will become apparent from the following detailed description of the invention when considered in conjunction with the drawings, in which:

FIG. 3 is a table illustrating state transitions and controller directives for the exemplary TAP controller of FIGS. 1A and 1B;

FIG. 4 is a table illustrating valid command sequences for the exemplary TAP controller of FIGS. 1A and 1B;

FIG. 5 is a schematic diagram illustrating an exemplary error report test result generated by the embedded boundary scan controller of FIGS. 1A-1C.

DETAILED DESCRIPTION OF THE INVENTION

Figure 1A:
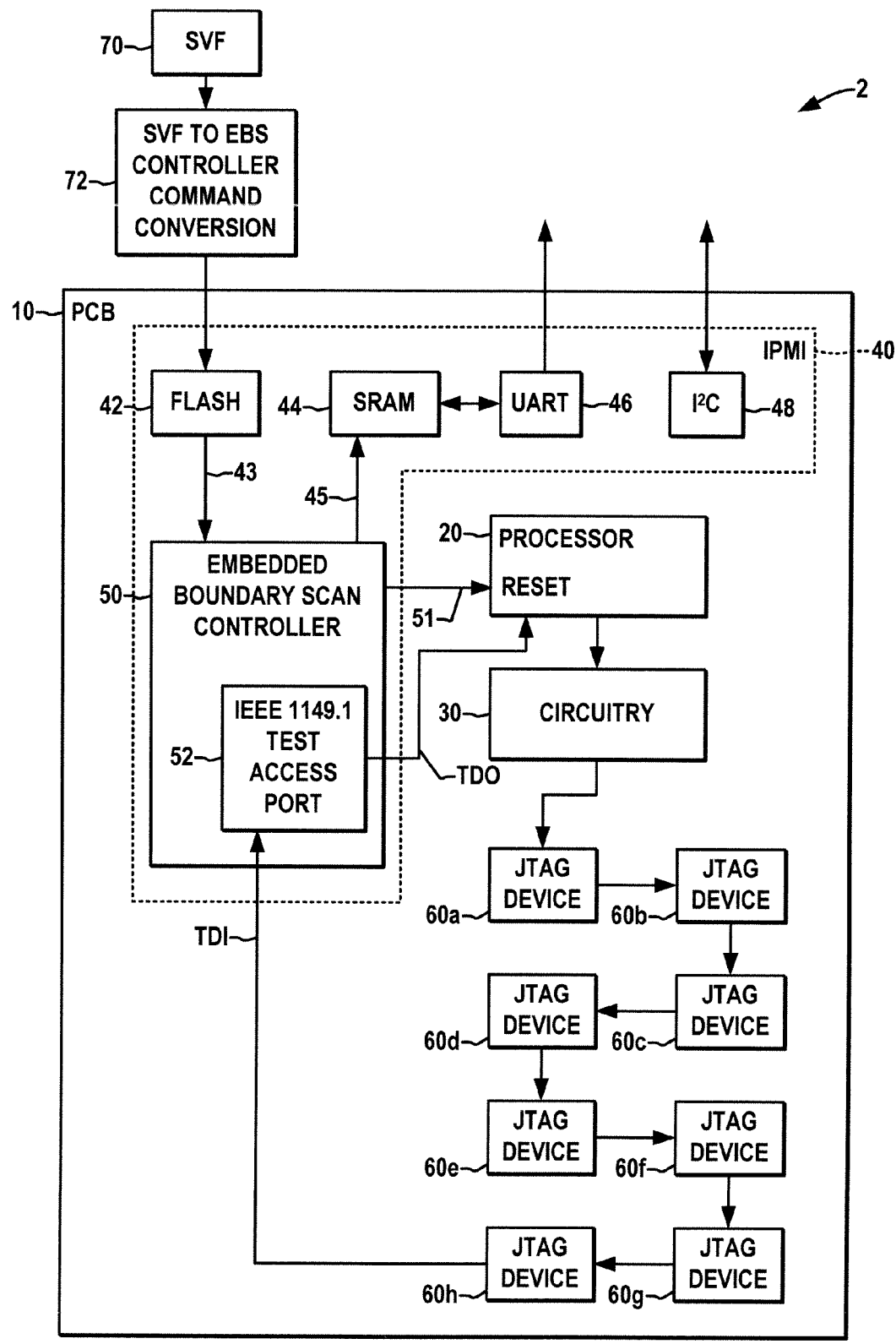
FIG. 1A is a schematic diagram illustrating an exemplary printed circuit board apparatus with an embedded boundary scan testing system in accordance with various aspects of the present disclosure.

Referring now to the figures, several embodiments or implementations of the various aspects of the present disclosure are hereinafter illustrated and described in conjunction with the drawings, wherein like reference numerals are used to refer to like elements.

Figure 1B:
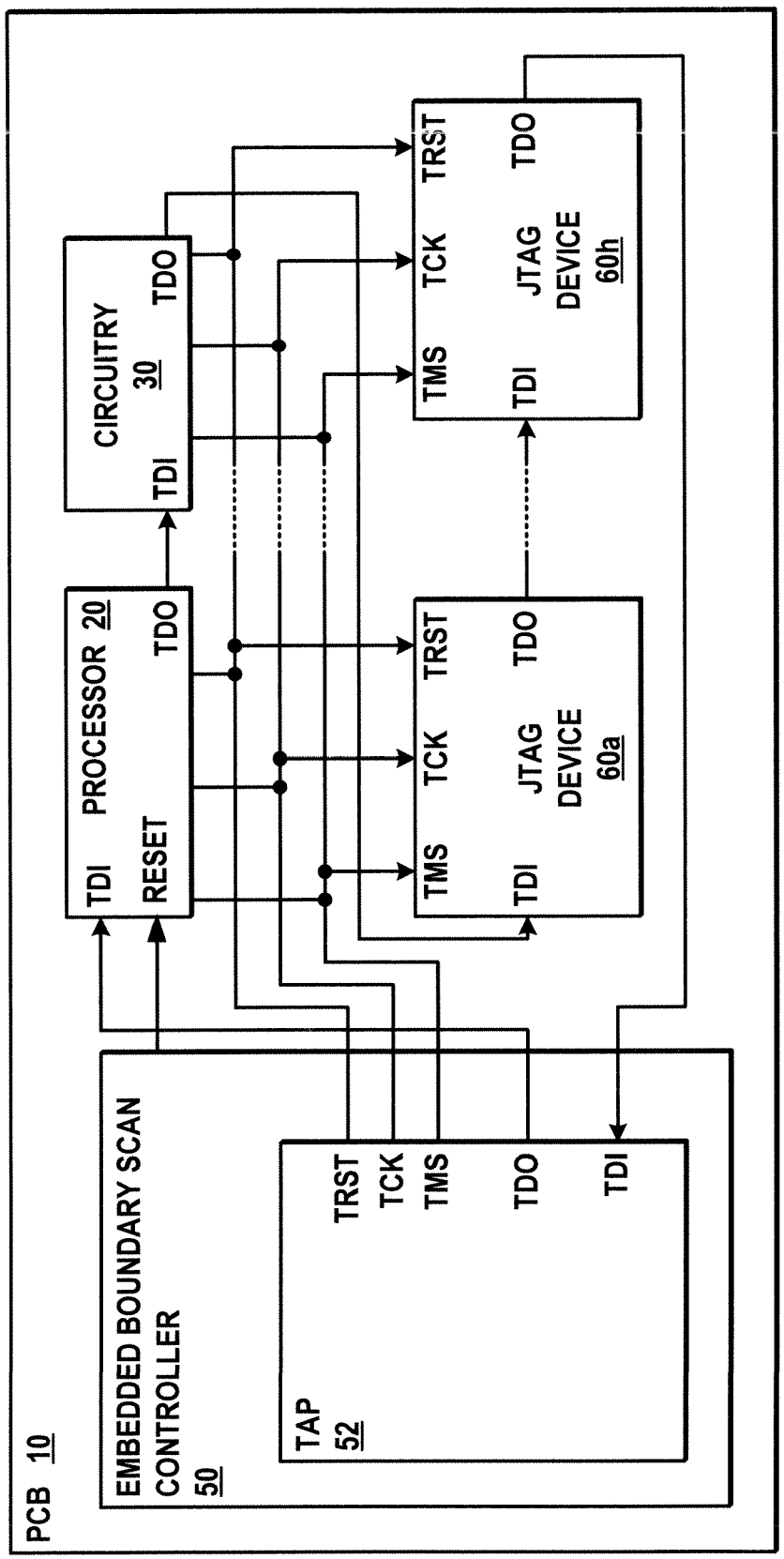
FIG. 1B is another schematic diagram illustrating further details of the embedded boundary scan testing system in the circuit board apparatus of FIG. 1A.
Figure 1C:
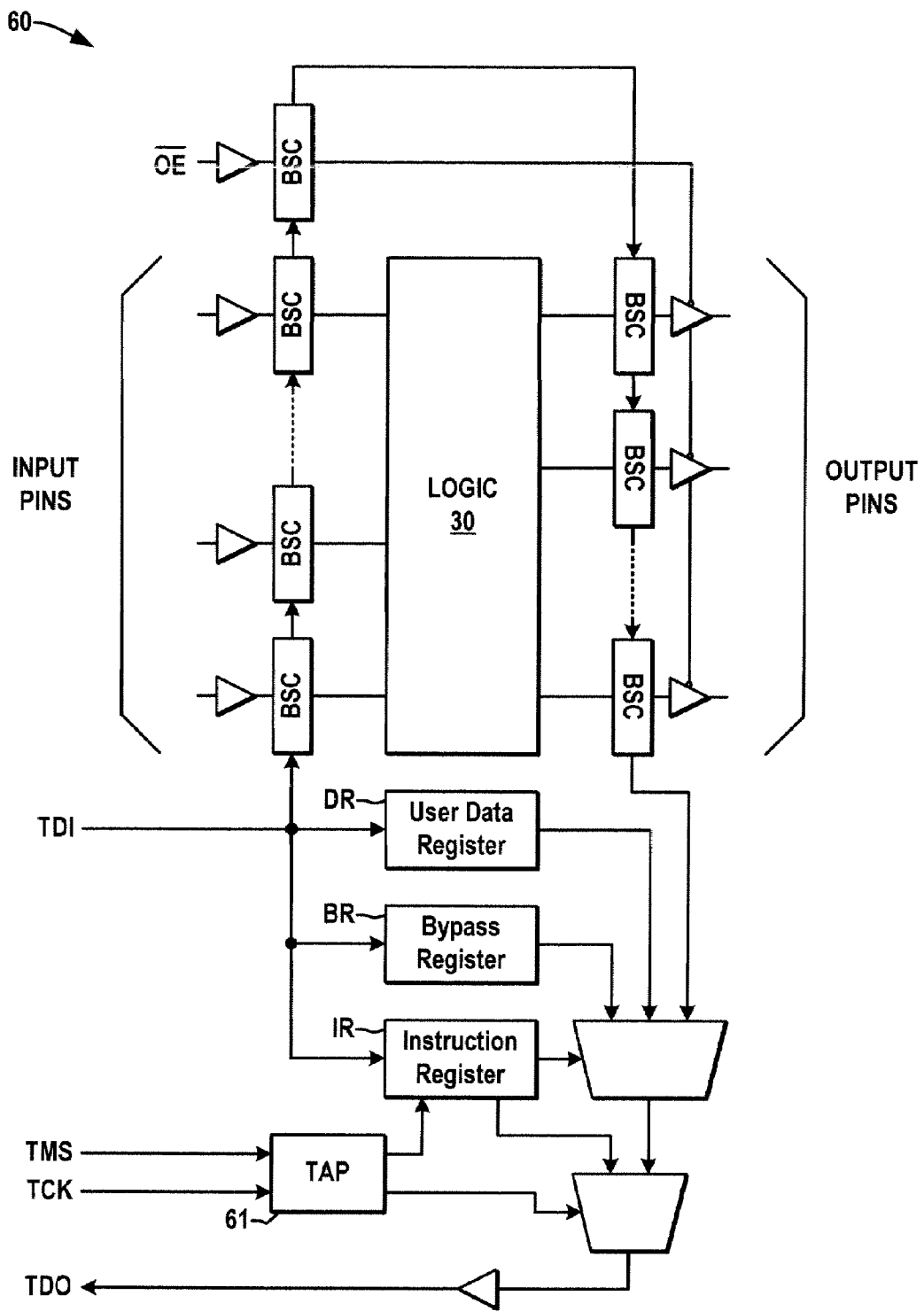
FIG. 1C is a schematic diagram illustrating further details of an exemplary JTAG device in the boundary scan chain of FIGS. 1A and 1B.
Figure 2:
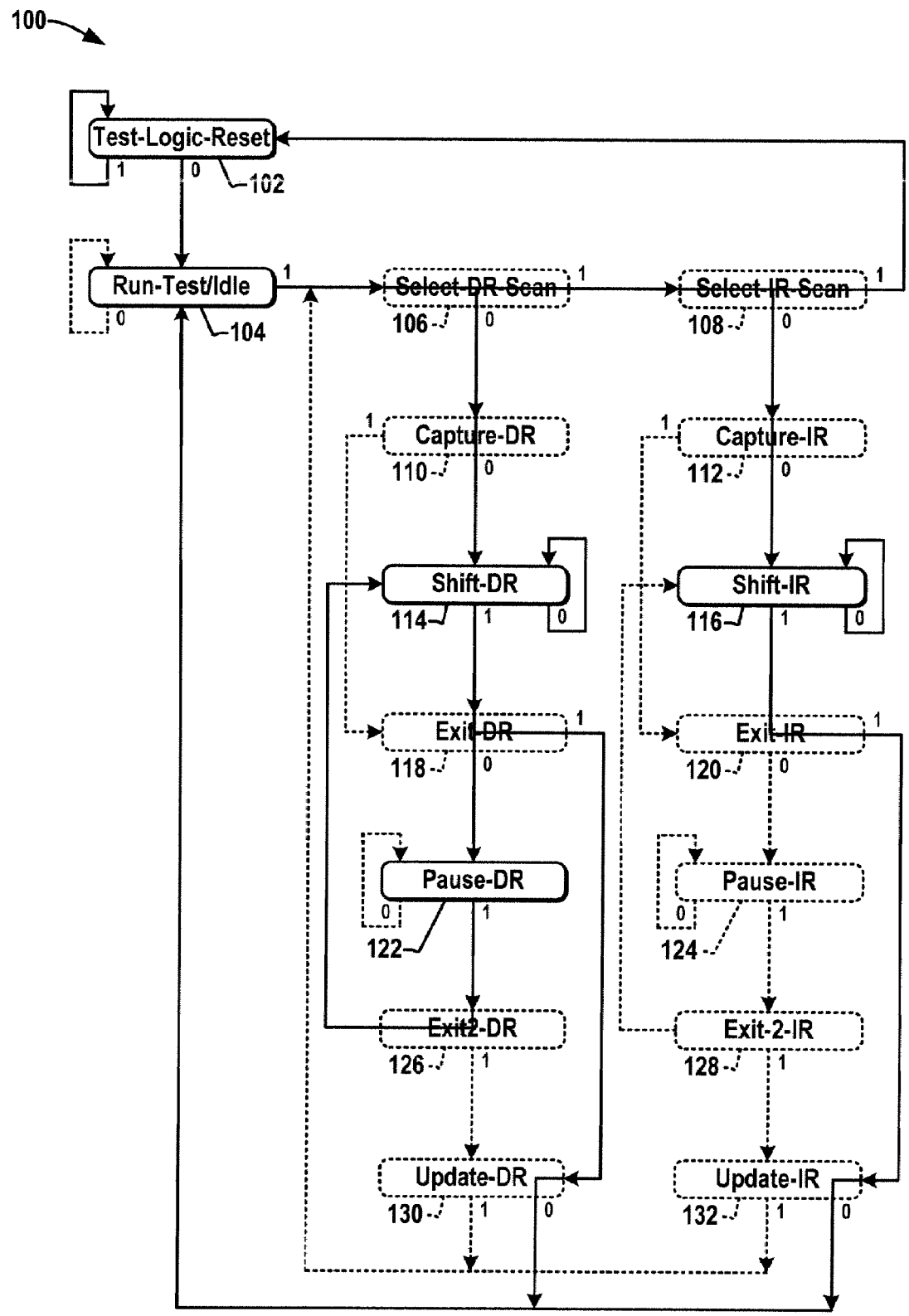
FIG. 2 is a schematic diagram illustrating an exemplary TAP controller state machine implementation in the boundary scan controller of FIGS. 1A-1C that implements only a subset of the standard TAP controller states.

FIGS. 1A-1C illustrate an exemplary PCB apparatus 10 with a processor system 20 and an embedded boundary scan testing system 40 in accordance with various aspects of the present disclosure, where FIG. 1A shows an initial situation 2 in which boundary scan commands and vectors are stored into an on-board non-volatile memory, such as when the board 10 is manufactured. The PCB 10 can be any type of processor-based circuit board, for example, an LCP2, LCP3, or LCP6 6U CompactPCI® (cPCI) and CompactPCI® Packet Switched Backp lane (cPSB) card 10 for use in a platform feature server telecommunications system application in the illustrated embodiments. In one implementation shown in FIG. 1A, the boundary scan system is incorporated along with other circuitry as part of an Intelligent Platform Management Interface (IPMI) Field Programmable Gate Array (FPGA) 40, although the present disclosure is not limited to this specific application. The board 10 further includes various integrated circuits and other components forming one or more electrical circuits including circuitry 30 and the processor system 20. The processor system 20 may be a single processor device, or may include any number of individual electronic components that form a processor system, including without limitation microprocessors, microcontrollers, programmable logic, DSPs, memory components, system controllers, etc. The PCB apparatus 10 further comprises a boundary scan chain including the processor system 20 and components thereof, the circuitry 30, and a plurality of JTAG devices 60a-60h connected with the electrical circuits of the PCB 10, further details of which are illustrated and described in greater detail below with respect to FIG. 1C. Although the processor system 20, the circuitry 30, and the other eight JTAG devices 60 are shown in the example of FIGS. 1A and 1B, any number of JTAG devices 60 may be used in a given boundary scan chain, wherein the present disclosure is not limited to the illustrated implementations. The processor system 20, the circuitry 30, and the remainder of the boundary scan chain 60a-60h are operatively coupled with an embedded (i.e., on-board) boundary scan controller 50 that itself is mounted on the printed circuit board 10.

The boundary scan controller 50 can be any form of hardware mounted on the board 10 and includes a reset output 51 operatively coupled with one or more reset control inputs of the processor system 20 by which the scan controller 50 can selectively hold the processor system 20 in a reset state during boundary scan testing. The embedded boundary scan controller 50 controls an IEEE 1149.1 JTAG compliant test access port (TAP) controller 52 operatively coupled with the boundary scan chain 20, 30, 60a-60h to perform boundary scan testing of the electrical circuit while the processor system 20 is held at reset.

The exemplary boundary scan system 40 further includes a non-volatile memory component 42, in one example a FLASH memory device 42, which is mounted on the circuit board apparatus 10 for storing boundary scan test vectors and commands. In the example application 2 of FIG. 1A, ASCII Serial Vector Format (SVF) boundary scan vectors 70 are converted into binary format expected by the EBS controller 50 via an SVF to EBS conversion 72 and the binary format vectors and boundary scan commands 43 are stored into the FLASH memory 42. Upon powering the board 10 up or on demand, the boundary scan controller 50 can read these from the non-volatile memory 42 and use them to perform the boundary scan testing of the PCB 10, where the loading is preferably done in streaming fashion with one vector/command being loaded and run before loading the next vector/command, until the controller 50 loads an END directive.

The PCB 10 further comprises SRAM or other form of on-board memory 44 (which may be integrated with the non-volatile memory 42) that is coupled with the boundary scan controller 50, where the controller 50 stores boundary scan results 45 (e.g., such as error reports 400 as shown below in FIG. 5) in the memory 44. Moreover, the exemplary memory 44 is externally accessible in the illustrated embodiment in order to facilitate trouble shooting and/or board repair operations, wherein the illustrated EBS system 40 includes a UART 46 operatively coupled with the memory 44 to allow retrieval of the boundary scan results by an external device (not shown). In the exemplary IPMI FPGA example of FIG. 1A, moreover, the IPMI system 40 further includes an I²C serial data interface 48. Other possible implementations allow for test result retrieval via other means, such as providing a test pass/fail indication using an LED or other means mounted on the board 10.

Referring also to FIGS. 1B and 1C, the exemplary boundary scan testing involves locating a shift register and latch (BSCs in FIG. 1C) at the functional I/O nodes of the circuit 30 of the board 10, where each such I/O pin can be driven to a known state or the current logic level can be measured and scanned out using a four or five-wire serial bus for testing the interconnections between circuit components and/or the components themselves. The boundary scan TAP controller 52 (FIG. 1B) interfaces with the scan chain devices 20, 30, 60 via connections for a test clock signal (TCK), a test mode select signal (TMS), a test data input signal (TDI) and a test data output signal (TDO), and may further provide an optional test reset (TRST) signal. The TDO and TDI terminals of the JTAG devices 20, 30, 60 are interconnected from one device 20, 30, 60 to the next device 20, 30, 60 in a daisy-chain configuration forming the boundary scan chain, with a TAP port 61 (FIG. 1C) of each device 20, 30, 60 being connected to the common TRST, TCK, and TMS signals from the TAP controller 52. Since the TDI and TDO terminals of the JTAG devices 60 are interconnected in the boundary scan chain 118, the TAP controller 52 can send commands to and receive results from each of the JTAG devices 20, 30, 60 in a serial shifting operation to perform boundary scan testing according to the predefined vectors and commands 43 received from the FLASH memory (FIG. 1A). In this manner, the TAP controller 52 operates to verify or test a plurality of JTAG compliant devices in automated fashion without requiring processor intervention or connection to external test equipment.

FIG. 1C shows further details of an exemplary JTAG device 60 of the scan chain, in which a JTAG compliant logic portion of the PCB electrical circuit 30 is depicted along with related input and output pins and a boundary-scan path consisting of a series of boundary-scan cells (BSCs), where the illustrated example provides one BSC per logic circuit function pin or node, although other implementations are possible. The BSCs are interconnected to form a scan path between the TDI input and the TDO output. In non-testing operation of the circuitry 30 with the output enable signal (OE') held high, input and output signals are passed through the BSCs without modification, whereby the normal input data is provided to the logic 30 and outputs therefrom are provided to the data output pins. The JTAG controller 52 sets OE' low to activate the boundary scan testing mode of operation, in which the IC's I/O boundary is controlled so as to provide test stimulus via test vectors shifted in and applied from each BSC output, and test responses can be measured at BSC inputs. These measured states are then shifted out for comparison with the correct states by the controller 50 to ascertain whether there is a problem with the circuit 30, i.e., whether there is a component or interconnection problem on the PCB 10. Connections from one IC or component to another is also possible through application of test signals from output BSCs and capturing test response at the input BSCs.

As best shown in FIG. 1C, the exemplary JTAG devices 20, 30, 60 each include an instruction register IR, a bypass register BR, a chain of boundary scan registers BSC, optional user data register(s) DR, and a test access port (TAP) 61, where the BSCs are connected in a data path between the test data input TDI and output TDO. The instruction register IR and the data registers DR are separate scan paths connected between the TDI and TDO, whereby the TAP 61 can selectively shift data through the corresponding instruction or data paths under control of the test clock (TCK) and test mode select (TMS) inputs, with TMS and TDI being sampled on the rising edge of TCK, and with TDO changing on the falling edge of the clock TCK. The instruction register IR is provided to store the current instruction and the TAP 61 determines therefrom where to shift the signals received at the TDI. The BR is generally a single-bit register that passes information directly from TDI to TDO to essentially bypass the device 60, allowing other devices in the circuitry 30 to be tested with minimal overhead.

Referring also to FIGS. 2-5, in accordance with further aspects of the disclosure, the exemplary TAP controller 52 may preferably be optimized from a hardware design perspective so as to avoid use of more than half of the standard JTAG TAP controller machine states. In this manner, the circuitry required to implement the embedded boundary scan controller 50 is reduced. The TAP controller 52 in this embodiment is constructed as a hardware state machine implementing only a limited number of valid command sequences so that the state machine transitions through more than 8 of 16 possible TAP machine states (i.e., transitions to fewer than half the standard TAP machine states). This is depicted schematically in a state diagram 100 of FIG. 2 with non-used JTAG states and transitions shown in dashed line form. EBS commands stored in the non-volatile memory 42 are read by the boundary scan controller 50 and used to transition between the valid states of the TAP controller state diagram. In the illustrated implementation, the streamlined TAP controller state machine design uses only a few select command sequences, whereby the controller simply transitions through most states to only the five of 16 possible TAP controller machine states including Test-Logic-Reset, Run-Test/Idle, Shift-DR, Pause-DR, and Shift-IR states, wherein the TAP controller state machine 52 terminates or ends the boundary scan testing for invalid command sequences.

FIG. 3 illustrates a table 200 showing state transitions and controller directives for the exemplary TAP controller 52, and FIG. 4 shows a table 300 of valid command sequences for TAP controller 52, in which invalid command sequences are shown as "Error" and valid sequences are shown as a check mark. The Test-Logic-Reset state includes disabling of all test logic to allow the normal operation of the circuitry 30. In the Run-Test-Idle controller state, the test logic is selectively activated if certain instructions are present. In the Shift-DR and Shift-IR states, the controller 52 shifts the data along the selected data or instruction path, and the Pause-DR state allows the shifting of the data register to be temporarily halted.

The boundary scan test commands and vectors 43 from the memory 42 (FIG. 1A) are provided in a 3-byte format in the example of FIG. 3, in which the first five commands are used to cause transitions in the TAP controller state diagram 100 (FIG. 2), and the last four commands are used to direct actions the controller should take. The SHIFT command includes a count of the number of bits to shift in or out, all commands read in after the SHIFT are vectors, and the boundary scan controller 50 continues to read vectors from the non-volatile memory 42 until the count is reached. The DEV_PATTERN command causes a desired pattern to be driven on the IPMI DEV_BUS, and the END command directs the TAP controller 52 to stop reading memory and puts the TAP controller 52 back into a Test-Logic-Reset state. The scan controller 50 thus obtains the desired testing parameters in the form of vectors and commands from the FLASH memory 42, and runs the tests using the TAP controller 52 and the scan chain 60, by which the resultant output data is shifted to the controller 52 via the TDO connection. In a preferred implementation, the controller 50 loads vectors/commands and runs the tests in streaming fashion one at a time until an END command is read from the memory 42.

The boundary scan controller 50 includes comparison logic or other suitable circuitry to compare the received data with expected values and to generate suitable test results. One exemplary error report test result format 400 is illustrated in FIG. 5. When the controller 50 detects a data mismatch or an invalid command sequence, an 8-byte error report 400 is written into the memory 44, wherein any number of such reports can be stored in the memory 44. In the example of FIG. 5, the Sequence-Error byte (byte 7) is set to 0x01 when a command sequence is not valid (i.e. Shift-DR followed by Shift-IR), and a pass (0x55) or fail (0x58) flag can be written to the IPMI Message Data Repository for the exemplary IPMI implementation 40.

Figure 6:
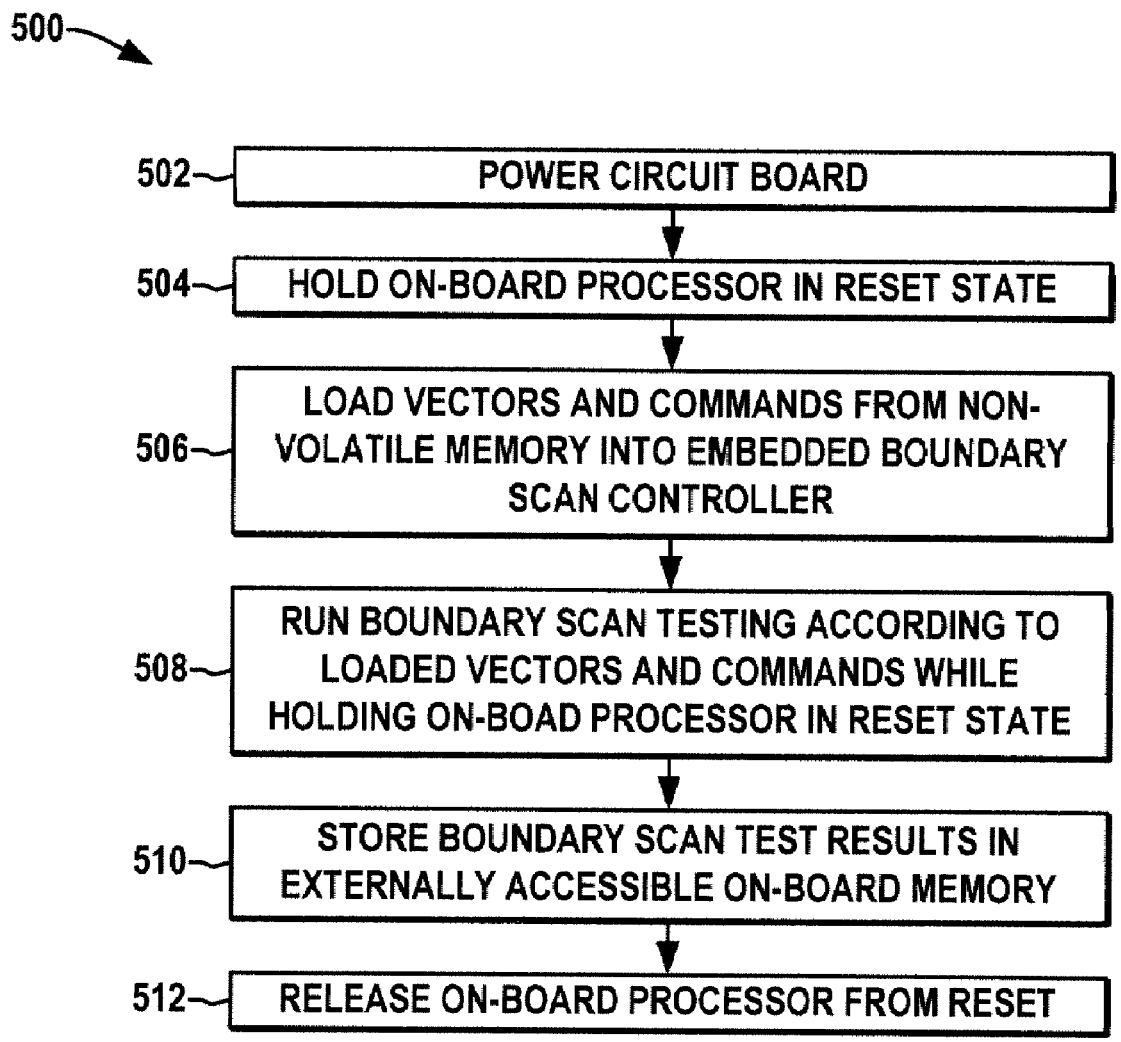
FIG. 6 is a flow diagram illustrating an exemplary method for embedded boundary scan testing of printed circuit boards in accordance with further aspects of the disclosure.

Referring now to FIG. 6, an exemplary method 500 is illustrated for embedded boundary scan testing of printed circuit boards in accordance with further aspects of the disclosure. Although the exemplary method 500 is illustrated and described in the form of a series of acts or events, the various methods of the invention are not limited by the illustrated ordering of such acts or events except as specifically set forth herein. In this regard, except as specifically provided hereinafter, some acts or events may occur in different order and/or concurrently with other acts or events apart from those acts and ordering illustrated and described herein, and not all illustrated steps may be required to implement a process or method in accordance with the present invention. The illustrated method 500 and other methods of the invention, moreover, may be implemented in hardware, software, or combinations thereof, in order to provide the embedded boundary scan test features as described herein, wherein these methods can be practiced in hardware and/or software of the above described processor-based PCB apparatus 10, or other circuit boards, wherein the invention is not limited to the specific applications and implementations illustrated and described herein.

The method 500 begins at 502 with application of power to the printed circuit board 10. At 504, any on-board processor system 20 is held in a reset state. The method further includes loading boundary scan test vectors and commands 43 at 506 from an on-board non-volatile memory 42 into an-on-board boundary scan controller 50, and running boundary scan testing at 508 in accordance with the loaded vectors and commands 43 while holding the processor system 20 in reset. In practice, the boundary scan vectors and commands are preferably read from the memory 42 one at a time at 506 and a single scan vector is run at 508 before reading the next vector/command at 506. Thus process continues in streaming fashion until the embedded boundary scan controller 50 loads an END directive from the memory at 506. At 510, the boundary scan test results 45 are stored in an externally accessible on-board memory 44, and the method 500 includes releasing the on-board processor system 20 from reset at 512 after completion of the boundary scan testing.

While the invention has been illustrated and described with respect to one or more exemplary implementations or embodiments, equivalent alterations and modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, although a particular feature of the invention may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

The following is claimed:

1. A circuit board apparatus with embedded boundary scan testing capabilities, comprising:
   a printed circuit board populated with electronic circuit components forming an electrical circuit;
   a boundary scan chain including a plurality of JTAG devices connected with the electrical circuit;
   a boundary scan controller mounted on the printed circuit board;

a JTAG compliant test access port controller operatively coupled with the boundary scan chain to perform boundary scan testing of the electrical circuit under control of the boundary scan controller; and further comprising a processor system forming part of the electrical circuit and including at least one JTAG compliant device forming part of the boundary scan chain, the processor system including a reset control input, wherein the boundary scan controller comprises a reset output operatively coupled with the reset control input of the processor system to hold the processor system in a reset state during boundary scan testing.

2. The circuit board apparatus of claim 1, further comprising a memory component mounted to the printed circuit board and operatively coupled with the boundary scan controller, wherein the boundary scan controller stores boundary scan results in the memory component.

3. The circuit board apparatus of claim 2, further comprising a Universal Asynchronous Receiver Transmitter (UART) operatively coupled with the memory component to allow retrieval of the boundary scan results by an external device.

4. The circuit board apparatus of claim 1, wherein the test access port controller comprises a state machine implementing only a limited number of valid command sequences so that the state machine transitions through more than 8 of 16 possible test access port (TAP) machine states.

5. The circuit board apparatus of claim 4, wherein the state machine of the test access port controller ends boundary scan testing for invalid command sequences.

6. The circuit board apparatus of claim 4, wherein the state machine of the test access port controller is operative to transition to only 5 of 16 possible test access port (TAP) controller machine states.

7. The circuit board apparatus of claim 6, wherein the state machine of the test access port controller is operative to transition to only Test-Logic-Reset, Run-Test/Idle, Shift-DR, Pause-DR, and Shift-IR states.

8. The circuit board apparatus of claim 1, further comprising a non-volatile memory component mounted to the printed circuit board and storing boundary scan test vectors and commands, wherein the boundary scan controller retrieves boundary scan test vectors and commands from the non-volatile memory component and uses the test vectors and commands to perform the boundary scan testing.

9. The circuit board apparatus of claim 1, wherein the processor system further comprises a test access port (TAP) portion and a non-TAP portion, and wherein the reset output of the boundary scan controller holds the non-TAP portion of the processor system in reset during boundary scan testing.

10. An embedded boundary scan testing system for testing an electrical circuit of a printed circuit board, the testing system comprising:

a boundary scan chain including a plurality of JTAG devices mounted on a circuit board and operatively coupled with an electrical circuit of the circuit board;

a boundary scan controller mounted on the circuit board;

a JTAG compliant test access port controller operatively coupled with the boundary scan chain to perform boundary scan testing of the electrical circuit under control of the boundary scan controller; and wherein the test access port controller comprises a state machine implementing only a limited number of valid command sequences so that the state machine transitions through more than 8 of 16 possible test access port (TAP) machine states.

11. The testing system of claim 10, wherein the boundary scan controller comprises a reset output operatively coupled with a reset control input of an on-board processor system forming part of the electrical circuit and including at least one JTAG compliant device forming part of the boundary scan chain of the printed circuit board to hold the processor system in a reset state during boundary scan testing.

12. The testing system of claim 11, further comprising a non-volatile memory component mounted to the printed circuit board and storing boundary scan test vectors and commands, wherein the boundary scan controller retrieves boundary scan test vectors and commands from the non-volatile memory component and uses the test vectors and commands to perform the boundary scan testing.

13. The testing system of claim 11, wherein the processor system further comprises a test access port (TAP) portion and a non-TAP portion, and wherein the reset output of the boundary scan controller holds the non-TAP portion of the processor system in reset during boundary scan testing.

14. The testing system of claim 11, wherein the reset output holds the processor system in the reset state during an entirety of the boundary scan test.

15. The testing system of claim 10, further comprising a memory component mounted to the printed circuit board and operatively coupled with the boundary scan controller, wherein the boundary scan controller stores boundary scan results in the memory component.

16. The testing system of claim 15, further comprising a universal asynchronous receiver transmitter (UART) operatively coupled with the memory component to allow retrieval of the boundary scan results by an external device.

17. The testing system of claim 10, wherein the state machine of the test access port controller ends boundary scan testing for invalid command sequences.

18. The testing system of claim 10, wherein the state machine of the test access port controller is operative to transition to only 5 of 16 possible test access port (TAP) controller machine states.

19. The testing system of claim 18, wherein the state machine of the test access port controller is operative to transition to only Test-Logic-Reset, Run-Test/idle, Shift-DR, Pause-DR, and Shift-IR states.

20. A method of embedded boundary scan testing for printed circuit boards, the method comprising:

applying power to a printed circuit board;

loading boundary scan test vectors and commands from an on-board non-volatile memory into an-on-board boundary scan controller;

holding a processor system of the circuit board in a reset state while running the boundary scan testing; and running boundary scan testing according to the loaded vectors and commands using an on-board boundary scan chain with a plurality of Joint Test Action Group (JTAG) devices.

21. The method of claim 20, further comprising releasing the on-board processor system from the reset state after completion of the boundary scan testing.

22. The method of claim 20, further comprising storing boundary scan test results in an externally accessible on-board memory.

* * * * *